United States Patent
Duncan

(10) Patent No.: US 8,013,649 B2
(45) Date of Patent: Sep. 6, 2011

(54) DYNAMIC CLOCK FEEDBACK LATCH

(75) Inventor: John L. Duncan, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 37 days.

(21) Appl. No.: 12/574,798

(22) Filed: Oct. 7, 2009

(65) Prior Publication Data

US 2011/0050309 A1  Mar. 3, 2011

Related U.S. Application Data

(60) Provisional application No. 61/238,957, filed on Sep. 1, 2009.

(51) Int. Cl.
*H03K 3/356* (2006.01)

(52) U.S. Cl. ........... 327/203; 327/199; 327/218; 326/93

(58) Field of Classification Search .......... 327/199, 327/201–203, 208, 210, 211, 215, 218, 219; 326/93, 95, 98
See application file for complete search history.

(56) References Cited

U.S. PATENT DOCUMENTS

| 5,646,557 A * | 7/1997 | Runyon et al. | 326/97 |
| 6,181,156 B1 * | 1/2001 | Durham et al. | 326/27 |
| 6,731,138 B2 * | 5/2004 | Heller et al. | 326/104 |

OTHER PUBLICATIONS

"Domino Logic." Oct. 9, 2002. Downloaded from http://6004.csail.mit.edu/6.371/handouts/L11.pdf on Jul. 8, 2009. pp. 1-26.
"Introduction to CMOS VLSI Design." Spring 2004. Downloaded from www.cmosvlsi.com/lect9.ppt on Sep. 17, 2009. pp. 1-34.

* cited by examiner

*Primary Examiner* — Lincoln Donovan
*Assistant Examiner* — Shikha Goyal
(74) *Attorney, Agent, or Firm* — E. Alan Davis; James W. Huffman

(57) ABSTRACT

A dynamic clock feedback latch includes a feedback path that generates a data value on an output as a function of data inputs in response to a clock input going low and generates a latching value on the output after a delay from the clock input going high. A first transistor pre-charges a node high while the clock input is low. A second transistor provides a drain path for draining the node low from the pre-charged value while the clock input is high. The output controls a third transistor during the delay to drain the node to a low value if the data value is high and to retain the high value if the data value is low. The feedback path generates the predetermined latching value on the output after the delay to cause an inverted value of the data value to be latched onto the node.

24 Claims, 3 Drawing Sheets

DYNAMIC CLOCK FEEDBACK LATCH

CROSS REFERENCE TO RELATED APPLICATION(S)

This application claims priority based on U.S. Provisional Application, Ser. No. 61/238,957, filed Sep. 1, 2009, entitled DYNAMIC CLOCK FEEDBACK LATCH, which is hereby incorporated by reference in its entirety.

FIELD OF THE INVENTION

The present invention relates in general to the field of dynamic logic in digital circuits, and particularly to latch circuits therein.

BACKGROUND OF THE INVENTION

There is a constant demand to reduce the clock cycle time of a microprocessor in order to process more instructions per second. Attempts to meet the demand have included reduction in circuit element geometries and process-related improvements. Another way to meet the demand has been the use of dynamic logic, particularly in critical timing paths. However, even dynamically evaluated data signals must eventually be latched. The delay associated with a static latch may be a relatively large proportion of the clock cycle time (or half clock cycle time), which takes away from the remaining portion of the clock cycle time that may be used by dynamic logic to evaluate the data. Therefore, what is needed is a way to reduce the delay associated with latching dynamically evaluated data.

BRIEF SUMMARY OF INVENTION

In one aspect the present invention provides a dynamic clock feedback latch. The dynamic clock feedback latch includes a feedback path configured to receive a clock input and one or more data inputs and configured to generate a data value on an output as a function of the one or more data inputs in response to the clock input going low and configured to generate a predetermined latching value on the output after a delay from the clock input going high. The dynamic clock feedback latch also includes a first transistor configured to provide a charge path from a charging source to a node to pre-charge the node to a high value while the clock input is low and to not provide the charge path while the clock input is high. The dynamic clock feedback latch also includes a second transistor configured to provide a drain path for selectively draining the node from the pre-charged high value to a low value while the clock input is high and to not provide the drain path while the clock input is low. The dynamic clock feedback latch also includes a third transistor coupled between the node and the second transistor and controlled by the output of the feedback path during the delay to drain the node to a low value through the second transistor drain path if the data value is high and to retain the node to the pre-charged high value in conjunction with the third transistor if the data value is low. The feedback path generates the predetermined latching value on the output after the delay from the clock input going high to cause to be latched onto the node an inverted value of the data value that was generated on the output as a function of the one or more data inputs.

In another aspect, the present invention provides a method for latching a data value in a dynamic clocked feedback manner. The method includes pre-charging a node to a high value while a clock input is low. The method also includes generating a data value on an output as a function of one or more data inputs in response to the clock input going low. The method also includes during an initial portion of the clock input being high, draining the node from the pre-charged high value to a low value if the data value is high and retaining the node to the pre-charged high value if the data value is low. The method also includes during a terminal portion of the clock input being high, generating a predetermined value on the output to cause the node to be isolated in order to latch onto the node either the low value or the high value in response to said draining or said retaining based on the data value during the initial portion of the clock input being high.

In yet another aspect, the present invention provides a computer program product for use with a computing device, the computer program product comprising a computer usable storage medium having computer readable program code embodied in said medium for specifying a dynamic clock feedback latch. The computer readable program code includes first program code for specifying a feedback path configured to receive a clock input and one or more data inputs, and configured to generate a data value on an output as a function of the one or more data inputs in response to the clock input going low, and configured to generate a predetermined latching value on the output after a delay from the clock input going high. The computer readable program code also includes second program code for specifying a first transistor configured to provide a charge path from a charging source to a node to pre-charge the node to a high value while the clock input is low and to not provide the charge path while the clock input is high. The computer readable program code also includes third program code for specifying a second transistor configured to provide a drain path for selectively draining the node from the pre-charged high value to a low value while the clock input is high and to not provide the drain path while the clock input is low. The computer readable program code also includes fourth program code for specifying a third transistor coupled between the node and the second transistor and controlled by the output of the feedback path during the delay to drain the node to a low value through the second transistor drain path if the data value is high and to retain the node to the pre-charged high value in conjunction with the third transistor if the data value is low. The feedback path generates the predetermined latching value on the output after the delay from the clock input going high to cause to be latched onto the node an inverted value of the data value that was generated on the output as a function of the one or more data inputs.

DETAILED DESCRIPTION OF THE INVENTION

Described herein are circuits that employ embodiments of a dynamic clock feedback latch that effectively removes the latch from the critical path, thereby effectively removing the delay associated with the latch.

Figure 1:
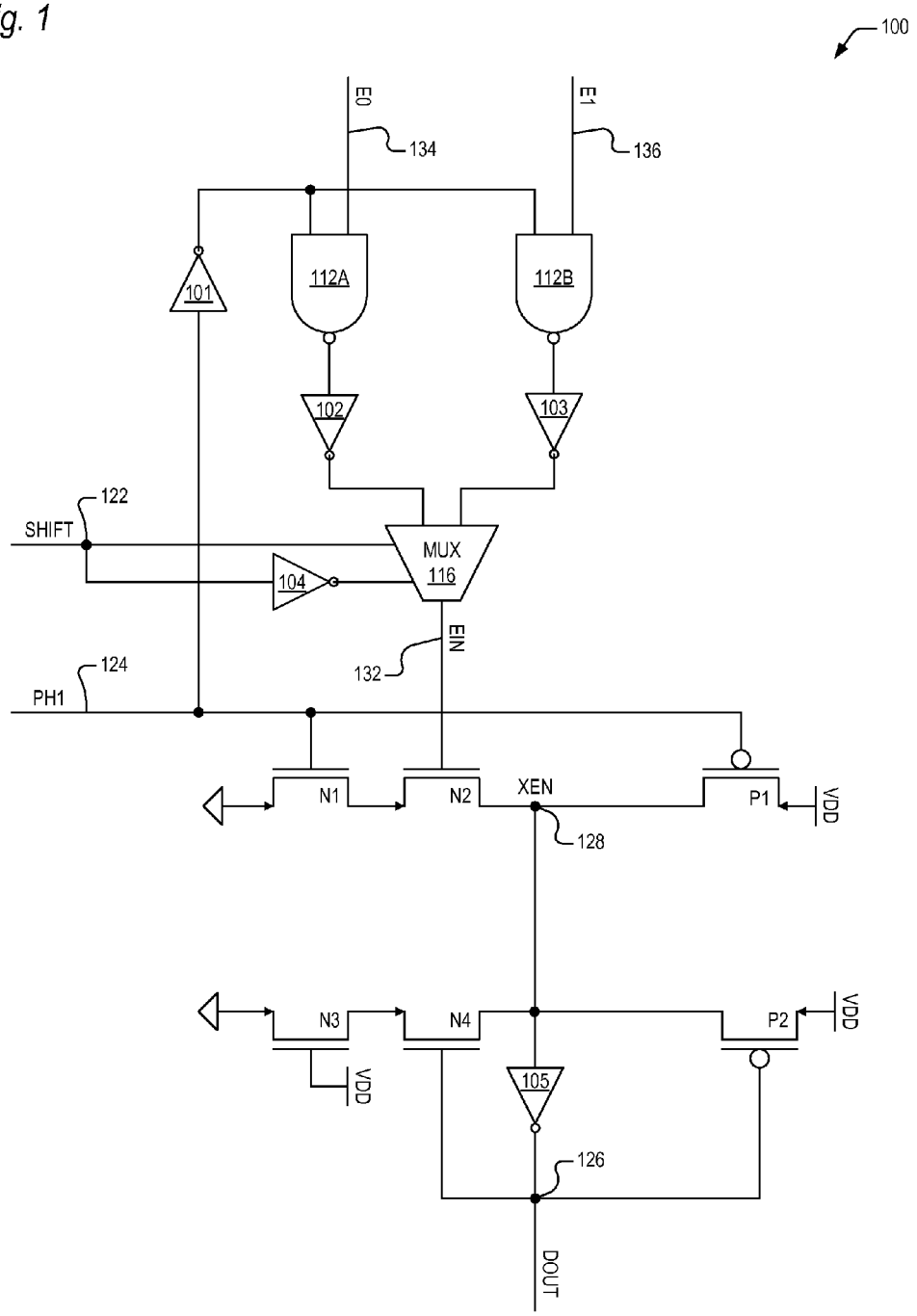
FIGS. 1, 2, and 3 are circuit diagrams illustrating circuit that incorporates a dynamic clock feedback latch according to first, second and third embodiments.

Referring now to FIG. 1, a circuit diagram illustrating a circuit 100 that incorporates a dynamic clock feedback latch according to a first embodiment is shown. The circuit 100 has four inputs: E0 134, E1 136, SHIFT 122, and PH1 124. The circuit 100 has one output: DOUT. A first 2-input NAND gate 112A receives E0 on a first input, and a second 2-input NAND gate 112B receives E1 on a first input. By convention, in the description of the circuits herein, a Boolean 0 (zero) state is associated with a low voltage state, and a Boolean 1 (one) state is associated with a high voltage state.

The second input of each of the NAND gates 112 receives the output of a first inverter 101. The first inverter 101 receives PH1 124 on its input. The output of the first NAND gate 112A is provided to a second inverter 102, and the output of the second NAND gate 112B is provided to a third inverter 103. The outputs of the first inverter 101 and the second inverter 102 are provided as inputs to a 2-to-1 mux 116. The output of the mux, which is net EIN 132, is provided to the gate of an N-channel transistor N2. The mux 116 is controlled by the SHIFT 122 input and the output of a fourth inverter 104 which receives SHIFT 122 as its input. When PH1 124 is high, inverter 101, NAND gates 112, inverters 102 and 103, and mux 116 collectively function as a feedback path to feedback PH1 124 to force EIN 132 low in order to dynamically latch in the value of EIN 132, as discussed in detail below.

An N-channel transistor N1 has its source coupled to ground, its drain coupled to the source of N2, and its gate coupled to PH1 124. A P-channel transistor P1 has its source coupled to VDD, its drain coupled to the drain of N2 at net XEN 128, and its gate coupled to PH1 124.

A fifth inverter 105 has its input coupled to net XEN 128 and its output is output DOUT 126. An N-channel transistor N3 has its source coupled to ground, its gate coupled to VDD, and its drain coupled to the source of an N-channel transistor N4. N4 has its drain coupled to net XEN 128 and its gate coupled to DOUT 126. A P-channel transistor P2 has its source coupled to VDD, its drain coupled to the drain of N4 at net XEN 128, and its gate coupled to DOUT 126. Inverter 105, N4 and P2 form a "jam" latch to latch an inverted value of XEN 128.

The SHIFT 122 input is the critical path input to the circuit 100, i.e., it is the input that arrives latest. The E0 134 input is generated by a cone of logic (not shown) that may receive a plurality of inputs, and the E1 136 input is generated by an almost identical cone of logic (not shown) that receives the same plurality of inputs; however, the cone of logic that generates E0 134 assumes that SHIFT 122 is a zero and the cone of logic that generates E1 136 assumes that SHIFT 122 is a one. Thus, when PH1 124 is low, by operation of inverter 101 generating a 1 to the inputs of the NAND gates 112, the mux 116 effectively receives E0 134 and E1 136 and is controlled by SHIFT 122 such that if SHIFT 122 is 0 the mux selects E0 134 for output on EIN 132, and if SHIFT 122 is a 1 the mux selects E1 136 for output on EIN 132. This enables SHIFT 122 arrive valid as late as possible before PH1 124 goes high.

When PH1 124 is low:
1. N1 gets turned off and P1 gets turned on, which causes XEN 128 to be precharged to a 1.
2. As discussed above, the 0 value of PH1 124 gets provided to inverter 101 such that inverter 101 generates a 1 to the respective inputs of NAND gate 112A and NAND gate 112B, which causes the values of E0 134 and E1 136 to be provided to the mux 116.
3. Thus, the value of EIN 132 is the value of whichever of E0 134 or E1 136 is selected by SHIFT 122.

When PH1 124 goes high:
1. N1 gets turned on and P1 gets turned off. Therefore:
   a. if EIN 132 is a 1, N2 is on, which causes the precharge on XEN 128 to drain to a 0;
   b. if EIN 132 is a 0, N2 is off, which causes the precharge on XEN 128 to remain at 1.
   c. Thus, while PH1 124 is high, XEN 128 effectively evaluates to the inverted value of EIN 132 that was generated while PH1 124 was low.
2. The 1 value of clock PH1 124 gets fed back such that inverter 101 generates a 0 to the respective inputs of NAND gate 112A and NAND gate 112B, which after two more gate delays causes both inputs of the mux 116 to be 0, which forces EIN 132 to 0, which turns off N2. Since P1 and N2 are now both off, and since the three-plus gate delays through the feedback path are more than sufficient for the precharge to drain off of XEN 128 if EIN 132 was a 1, advantageously the inverted value of EIN 132 that was generated during PH1 124 low is latched onto net XEN 128.

Thus, it may be observed that, advantageously, the feedback data path that feeds PH1 124 back through to mux 116, in cooperation with the stacked transistors N1, N2, and P1, operates while clock PH1 124 is high to perform a dynamic latching function to latch the inverted value of EIN 132 onto net XEN 128 without the delay associated with a conventional static PH2 latch that would otherwise be needed (PH2 being the clock signal that is the inversion of clock PH1 124). That is, advantageously, the dynamic clock feedback latch is not in the critical path as a conventional static latch would be.

The inverted value of XEN 128 subsequently gets latched into the jam latch. The jam latch is useful, for example, in a microprocessor design in which it is desirable to be able to turn off the clocks and retain the value on net XEN 128, such as to perform single-stepping debug operation of the microprocessor. More specifically, because the feedback path forces EIN 132 to 0 while PH1 124 is high, P1 and N2 are both off, which means the inverted value of EIN 132 that is dynamically latched onto XEN 128 is floating, and if the latched value is high, the charge would eventually drain off of net XEN 128 if the microprocessor clocks were turned off. However, the jam latch is not necessary in an embodiment in which the dynamic clock feedback latch mechanism is incorporated into a pure dynamic logic circuit, i.e., that does not require the retention of data values when the clocks are turned off.

It is noted that once PH1 124 has been fed back such that EIN 132 is forced to 0, the value of SHIFT 122 can fluctuate and it will not affect the value of EIN 132. However, SHIFT 122 cannot change (i.e., pre-charge) between the time that PH1 124 goes high and EIN 132 gets forced to 0 by the feedback of PH1 124. This is the hold constraint for SHIFT 122 to PH1 124 rising. Additionally, the setup time for SHIFT 122 is the delay through inverter 104 and the mux 116, which is advantageously very small.

As may be observed, the dynamic clock feedback latch mechanism described above advantageously eliminates a conventional static latch delay. A speed advantage is obtained by eliminating a conventional static latch between EIN 132 and PH1 124 gated clock. The dynamic latching is accomplished by forcing EIN 132 to 0 so that N2 is turned off, which in combination with P1 being turned off by PH1 124 being high causes the value of EIN 132 at the rising of PH1 124 to be held between the two off transistors. The forcing of EIN 132 to 0 is accomplished by feeding PH1 124 high back through the feedback path which is designed to serve the dual purpose of generating the proper value on the output signal (EIN 132) according to the desired logic function when PH1 124 is low and generating a value on the output signal (EIN 132) when PH1 124 is high that will turn off the transistor that receives it (in the circuit 100 of FIG. 1, the value is a low value to turn off N-channel device N2). The advantage is that the dynamic latching function (feeding PH1 124 back to force the output EIN 132 to the latching value, which is 0 in FIG. 1) does not interfere in any way with the critical path. That is, the critical path no longer has a static latch delay in it.

Figure 2:
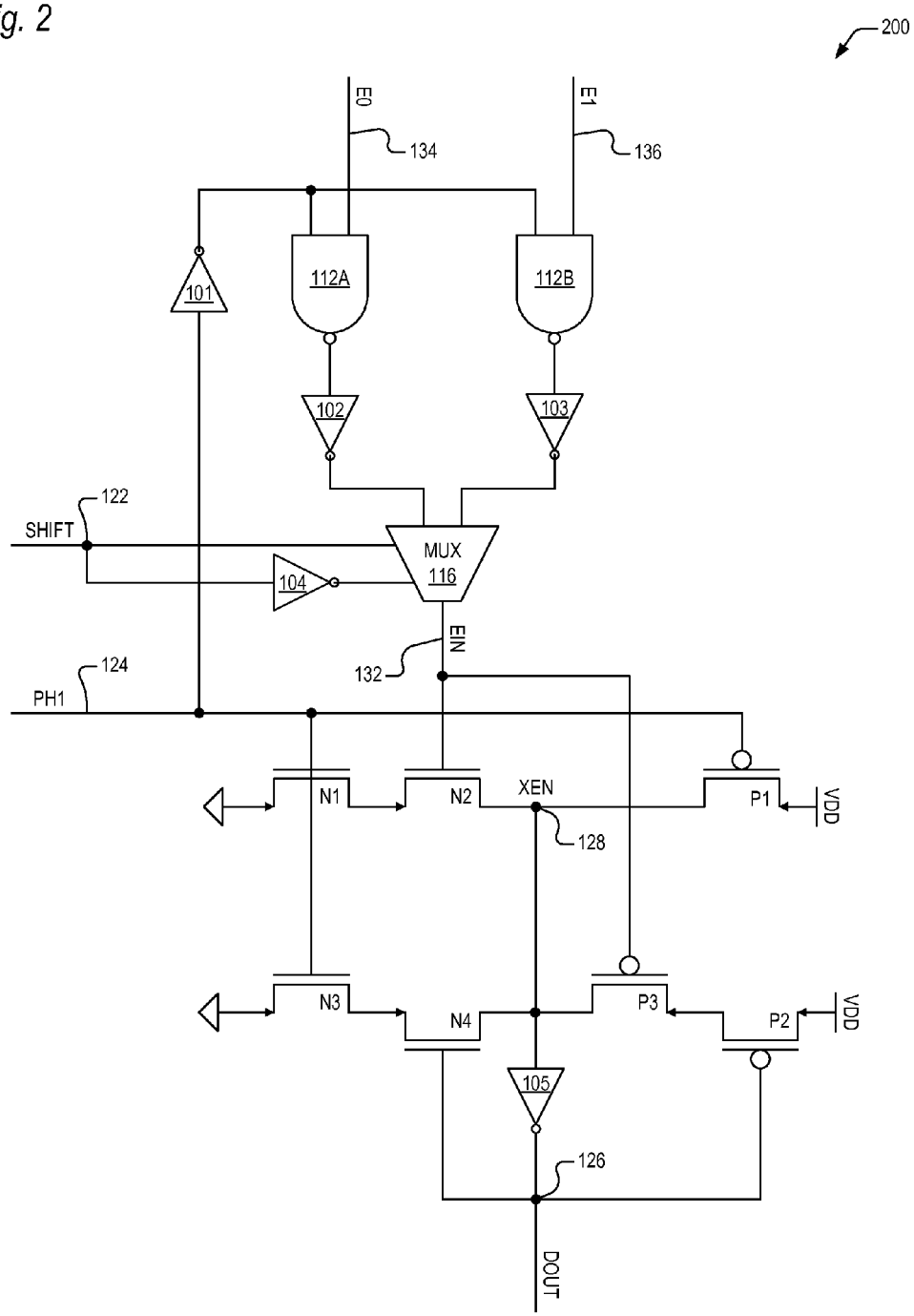

Referring now to FIG. 2, a circuit diagram illustrating a circuit 200 that incorporates a dynamic clock feedback latch according to a second embodiment is shown. The circuit 200 is similar in many respects to the circuit 100 of FIG. 1 with the following differences. Circuit 200 includes a P-channel transistor P3 that separates P2 from net XEN 128. More specifically, the source of P3 is coupled to the drain of P2, the drain of P3 is coupled to net XEN 128, and the gate of P3 is coupled to EIN 132. Additionally, in circuit 200, the gate of N3 is coupled to PH1 124, rather than to VDD as in circuit 100 of FIG. 1.

In the embodiment of FIG. 1, when EIN 132 evaluates to 1, this will cause N2 to turn on and drain the precharge off of node XEN 128. However, if the previous value of DOUT 126 is 0, then P2 is turned on and it will try to keep charging node XEN 128. For this reason, N1 and N2 are relatively much larger than P2 so that they can easily drain the charge that P2 is supplying until the 0 value of XEN 128 propagates through inverter 105 as a 1 and turns off P2. This is called a "jam" latch because N1 and N2 overcome P2 to "jam" XEN 128 to a 0.

In contrast, the embodiment of FIG. 2 includes P3, which gets turned off when EIN 132 is 1, which prevents P2 from continuing to charge XEN 128 as in FIG. 1. This allows N1 and N2 to be smaller in the embodiment of FIG. 2 than in the embodiment of FIG. 1. A potential advantage of the embodiment of FIG. 2 is that it may be a smaller circuit 200 on the whole than circuit 100 because the size savings on N1 and N2 may outweigh the additional size of P3, which is relatively small.

Figure 3:
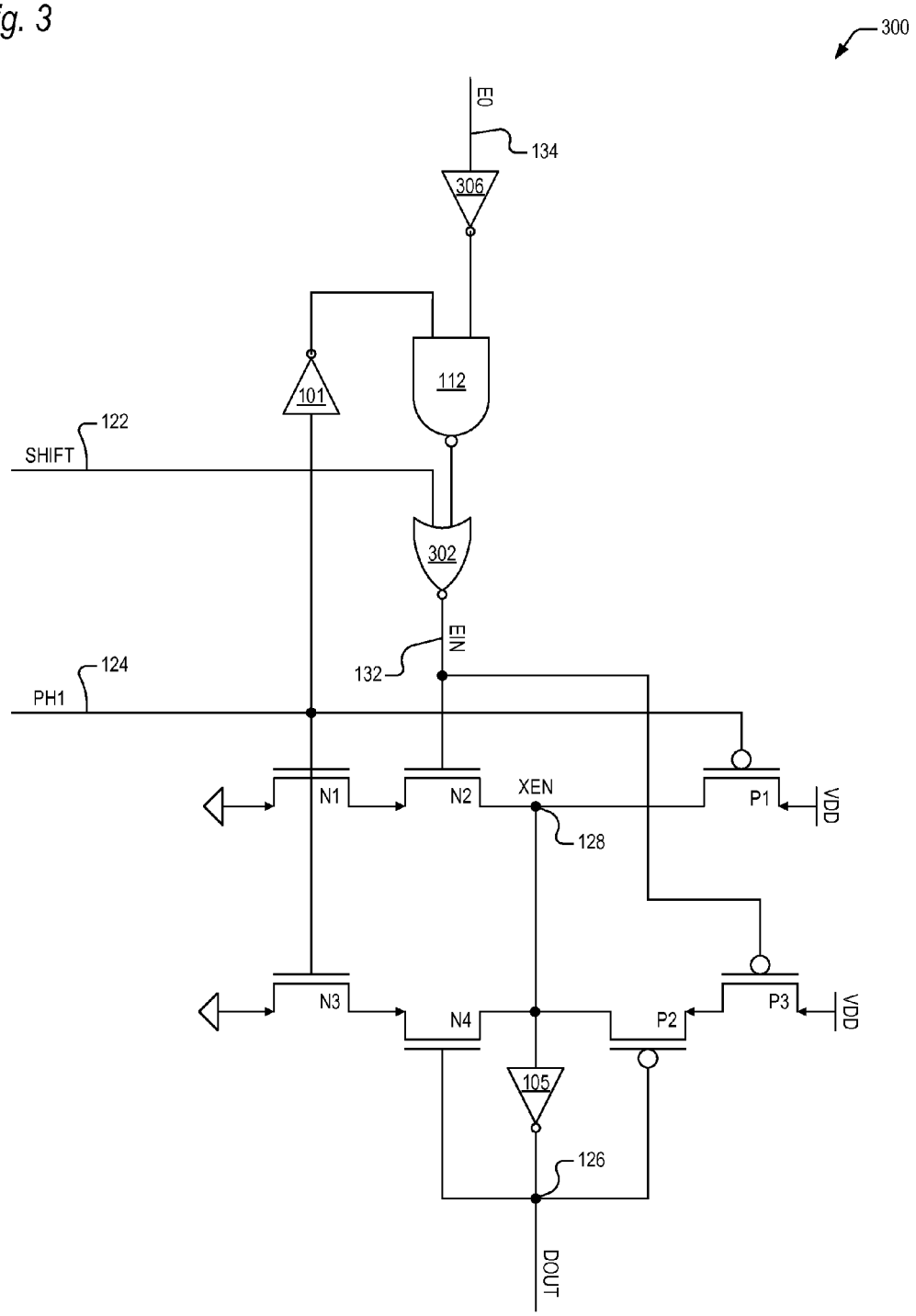

Referring now to FIG. 3, a circuit diagram illustrating a circuit 300 that incorporates a dynamic clock feedback latch according to a third embodiment is shown. The circuit 300 is similar in many respects to the circuit 200 of FIG. 2 with the following differences. In circuit 300, P2 and P3 are horizontally juxtaposed; that is, the source of P3 is coupled to VDD, and the drain of P3 is coupled to the source of P2; and the drain of P2 is coupled to net XEN 128, and the source of P2 is coupled to the drain of P3. Additionally, the feedback path is different. The feedback path does not include NAND gate 112B, inverter 102, inverter 103, or mux 116. Rather, the output of inverter 101 is coupled only to the input of NAND gate 112. The other input of NAND gate 112 receives the output of an inverter 306, whose input receives E0 134. A NOR gate 302 receives on one input the output of NAND gate 112 and receives SHIFT 122 on its other input. The output of NOR gate 302 is coupled to net EIN 132.

Although particular embodiments of the clock feedback path are described with respect to FIGS. 1 and 2 (e.g., inverter 101, NAND gate 112A, NAND gate 112B, inverter 102, inverter 103, mux 116) and FIG. 3 (e.g., inverter 101, NAND gate 112, NOR gate 302), other embodiments are contemplated as long as the feedback path meets two requirements: (1) when PH1 124 goes high, the feedback path forces the output to a value (e.g., EIN 132 to 0) that turns off the receiving transistor (e.g., N2) so that the output value generated during PH1 124 low gets latched; and (2) when PH1 124 is low, it does not change the main cone of logic, i.e., it does not change the input values (e.g., E0 134 and E1 136).

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). Embodiments of the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a microprocessor device which may be used in a general purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

I claim:

1. A dynamic clock feedback latch, comprising:

a feedback path, configured to receive a clock input and one or more data inputs, and configured to generate a data value on an output as a function of the one or more data inputs in response to the clock input going low, and configured to generate a predetermined latching value on the output after a delay from the clock input going high;

a first transistor, configured to provide a charge path from a charging source to a node to pre-charge the node to a high value while the clock input is low and to not provide the charge path while the clock input is high;

a second transistor, configured to provide a drain path for selectively draining the node from the pre-charged high value to a low value while the clock input is high and to not provide the drain path while the clock input is low;

a third transistor, coupled between the node and the second transistor and controlled by the output of the feedback path during the delay to drain the node to a low value through the second transistor drain path if the data value is high and to retain the node to the pre-charged high value if the data value is low;

wherein the feedback path generates the predetermined latching value on the output after the delay from the clock input going high to cause to be latched onto the node an inverted value of the data value that was generated on the output as a function of the one or more data inputs.

2. The dynamic clock feedback latch of claim 1, wherein the first transistor comprises a P-channel device having a source coupled to the charging source, a drain coupled to the node, and a gate coupled to the clock input.

3. The dynamic clock feedback latch of claim 1, wherein the second transistor comprises an N-channel device having a source coupled to ground, a drain coupled to the third transistor, and a gate coupled to the clock input.

4. The dynamic clock feedback latch of claim 1, wherein the third transistor comprises an N-channel device having a source coupled to the second transistor, a drain coupled to the node, and a gate coupled to the feedback path output.

5. The dynamic clock feedback latch of claim 1, further comprising:
an output latch, having an input coupled to the node and configured to latch and output an inverted value of the node, wherein the output latch comprises:
an inverter, having an input coupled to the node;
a P-channel device having its gate coupled to the output of the inverter, its source coupled to the charging source, and its drain coupled to the node; and
an N-channel device having its gate coupled to the output of the inverter, its source coupled to ground, and its drain coupled to the node.

6. The dynamic clock feedback latch of claim 5, wherein the output latch further comprises:
a second P-channel device, coupled between the node and the first P-channel device, having its gate coupled to the output of the feedback path.

7. The dynamic clock feedback latch of claim 5, wherein the output latch further comprises:
a second P-channel device, coupled between the first P-channel device and the charging source, having its gate coupled to the output of the feedback path.

8. The dynamic clock feedback latch of claim 1, wherein the feedback path comprises combinatorial logic configured to generate the data value on the output as a function of the one or more data inputs and the clock input, wherein when the clock input is low the combinatorial logic generates the data value on the output as a function of the one or more data inputs, wherein when the clock input is high the combinatorial logic generates the predetermined latching value on the output regardless of the one or more data inputs.

9. The dynamic clock feedback latch of claim 8, wherein the feedback path comprises:
an inverter, having its input coupled to receive the clock input;
a NAND gate, having a first input coupled to receive the output of the inverter and a second input coupled to receive a first of the one or more data inputs; and
a NOR gate, having a first input coupled to receive the output of the NAND gate and a second input coupled to receive a second of the one or more data inputs.

10. The dynamic clock feedback latch of claim 8, wherein the feedback path comprises:
an inverter, having its input coupled to receive the clock input;
a first NAND gate, having a first input coupled to receive the output of the inverter and a second input coupled to receive a first of the one or more data inputs;
a second NAND gate, having a first input coupled to receive the output of the inverter and a second input coupled to receive a second of the one or more data inputs; and
a multiplexor, having first and second inputs coupled to receive inverted versions of the outputs of the first and second NAND gates, respectively, and a select control input coupled to receive a third of the one or more data inputs.

11. The dynamic clock feedback latch of claim 10, wherein the first of the one or more data inputs comprises combinatorial logic configured to generate a value that assumes the third of the one or more data inputs is high, wherein the second of the one or more data inputs comprises combinatorial logic configured to generate a value that assumes the third of the one or more data inputs is low.

12. A method for latching a data value in a dynamic clocked feedback manner, the method comprising:
pre-charging a node to a high value while a clock input is low;
generating a data value on an output as a function of one or more data inputs in response to the clock input going low;
during an initial portion of the clock input being high, draining the node from the pre-charged high value to a low value if the data value is high and retaining the node to the pre-charged high value if the data value is low; and
during a terminal portion of the clock input being high, generating a predetermined value on the output to cause the node to be isolated in order to latch onto the node either the low value or the high value in response to said draining or said retaining based on the data value during the initial portion of the clock input being high.

13. The method of claim 12, wherein said pre-charging is performed by a P-channel device coupled between a charging source and the node and controlled by the clock input.

14. The method of claim 12, wherein said draining the node comprises providing a drain path to ground by an N-channel device coupled between ground and the node and controlled by the clock input.

15. The method of claim 12, wherein said draining and retaining the node are performed by an N-channel device coupled to the node and controlled by the output data value.

16. The method of claim 12, further comprising:
latching and outputting an inverted value of the node during the terminal portion of the clock input being high, after said generating a predetermined value on the output to cause the node to be isolated in order to latch onto the node either the low value or the high value.

17. The method of claim 16, wherein said latching and outputting are performed by an output latch, comprising:
an inverter, having an input coupled to the node;
a P-channel device having its gate coupled to the output of the inverter, its source coupled to a charging source, and its drain coupled to the node; and
an N-channel device having its gate coupled to the output of the inverter, its source coupled to ground, and its drain coupled to the node.

18. The method of claim 17, wherein the output latch further comprises:
a second P-channel device, coupled between the node and the first P-channel device, having its gate coupled to the output of the feedback path.

19. The method of claim 17, wherein the output latch further comprises:
a second P-channel device, coupled between the first P-channel device and the charging source, having its gate coupled to the output of the feedback path.

20. The method of claim 12, wherein said generating the data value on the output as a function of one or more data inputs in response to the clock input going low and said generating the predetermined value on the output during the terminal portion of the clock input being high are performed by a feedback path comprising combinatorial logic configured to generate the data value on the output as a function of the one or more data inputs and the clock input, wherein when the clock input is low the combinatorial logic generates the data value on the output as a function of the one or more data inputs, wherein when the clock input is high the combinatorial logic generates the predetermined value on the output regardless of the one or more data inputs.

21. The method of claim 20, wherein the feedback path comprises:

an inverter, having its input coupled to receive the clock input;

a NAND gate, having a first input coupled to receive the output of the inverter and a second input coupled to receive a first of the one or more data inputs; and a NOR gate, having a first input coupled to receive the output of the NAND gate and a second input coupled to receive a second of the one or more data inputs.

22. The method of claim 20, wherein the feedback path comprises:

an inverter, having its input coupled to receive the clock input;

a first NAND gate, having a first input coupled to receive the output of the inverter and a second input coupled to receive a first of the one or more data inputs;

a second NAND gate, having a first input coupled to receive the output of the inverter and a second input coupled to receive a second of the one or more data inputs; and a multiplexor, having first and second inputs coupled to receive inverted versions of the outputs of the first and second NAND gates, respectively, and a select control input coupled to receive a third of the one or more data inputs.

23. The method of claim 22, wherein the first of the one or more data inputs comprises combinatorial logic configured to generate a value that assumes the third of the one or more data inputs is high, wherein the second of the one or more data inputs comprises combinatorial logic configured to generate a value that assumes the third of the one or more data inputs is low.

24. A computer program product for use with a computing device, the computer program product comprising:

a computer usable storage medium, having computer readable program code embodied in said medium, for specifying a dynamic clock feedback latch, the computer readable program code comprising:

first program code for specifying a feedback path, configured to receive a clock input and one or more data inputs, and configured to generate a data value on an output as a function of the one or more data inputs in response to the clock input going low, and configured to generate a predetermined latching value on the output after a delay from the clock input going high;

second program code for specifying a first transistor, configured to provide a charge path from a charging source to a node to pre-charge the node to a high value while the clock input is low and to not provide the charge path while the clock input is high;

third program code for specifying a second transistor, configured to provide a drain path for selectively draining the node from the pre-charged high value to a low value while the clock input is high and to not provide the drain path while the clock input is low; and fourth program code for specifying a third transistor, coupled between the node and the second transistor and controlled by the output of the feedback path during the delay to drain the node to a low value through the second transistor drain path if the data value is high and to retain the node to the pre-charged high value if the data value is low;

wherein the feedback path generates the predetermined latching value on the output after the delay from the clock input going high to cause to be latched onto the node an inverted value of the data value that was generated on the output as a function of the one or more data inputs.

* * * * *